United States Patent [19]

D'Arrigo et al.

[11] Patent Number: 4,669,177
[45] Date of Patent: Jun. 2, 1987

[54] PROCESS FOR MAKING A LATERAL BIPOLAR TRANSISTOR IN A STANDARD CSAG PROCESS

[75] Inventors: Sebastiano D'Arrigo, Houston; Michael C. Smayling, Missouri City, both of Tex.

[73] Assignee: Texas Instruments Incorporated, Dallas, Tex.

[21] Appl. No.: 791,968

[22] Filed: Oct. 28, 1985

[51] Int. Cl.⁴ .............................................. H01L 21/20
[52] U.S. Cl. ......................................... 29/571; 29/578; 29/590; 357/43; 357/35; 148/DIG. 96
[58] Field of Search .......................... 29/571, 578, 590; 357/23, 43, 35; 148/DIG. 96

[56] References Cited

U.S. PATENT DOCUMENTS

| 4,135,954 | 1/1979 | Chang et al. | 148/187 |
| 4,142,421 | 3/1979 | Tonnel et al. | 357/43 |
| 4,200,878 | 4/1980 | Ipri | 29/578 |
| 4,507,848 | 4/1985 | Smith | 29/576 B |
| 4,546,536 | 10/1985 | Anantha et al. | 29/571 |

Primary Examiner—Brian E. Hearn
Assistant Examiner—Tuan N. Quach

[57] ABSTRACT

A method of forming a lateral bipolar transistor in a semiconductor substrate of a second conductivity type by an MOS or CMOS process which includes growing a thin insulating layer over the substrate and diffusing a tank region of a first type of conductivity into the semiconductor substrate of a polarity opposite to that of the second conductivity type. A strip of polysilicon is deposited around a region between the emitter area and collector area on a face of the substrate over said oxide. Next an emitter region having the form of a band enclosing an undiffused central region within the polysilicon strip and a collector region located outside of the strip are diffused into the tank. The polysilicon prevents diffusion of implanted impurity into the tank region over which is superimposed the polysilicon. An electrically conducting layer is formed over the emitter and a portion of the polysilicon.

By using a strip of polysilicon to limit diffusion of the emitter and collector regions and by forming the emitter contact over both the emitter and polysilicon it is possible to achieve a smaller emitter geometry than is otherwise possible.

11 Claims, 18 Drawing Figures

PROCESS FOR MAKING A LATERAL BIPOLAR TRANSISTOR IN A STANDARD CSAG PROCESS

BACKGROUND

The present invention relates to a method of fabricating a lateral bipolar transistor in a CSAG (CMOS self-aligned gate) process.

In modern integrated circuit design there is an increasing need to integrate analog and digital functions on the same chip. Because of the densities possible metal oxide semiconductor processes are the ones most commonly used for this purpose although some analog functions still require bipolar transistors to achieve required performances. Examples of the foregoing are high temperature voltage references and high temperature current references. It is possible in the present state of the art to integrate bipolar transistors into a complementary metal oxide process but parasitic leakage toward the substrate degrades the intrinsic characteristics of the transistor and might be dangerous for other circuits resident on the same substrate.

A standard CSAG process integrates a lateral PNP (or NPN) transistor by using an N-tank (or P-tank) diffusion as base and two adjacent P+ (or N+) diffusions to form the emitter and collector. A polysilicon layer is used to define the distance between the emitter and collector. In such a structure together with the desired bipolar lateral transistor there are two additional parasitic transistors formed. One is a MOS transistor whose source is the emitter, whose gate is the polysilicon layer and whose drain is the collector. The second parasitic transistor is the bipolar transistor which has as its emitter the emitter of the lateral transistor, as its base the base of the lateral transistor and as its collector the substrate. The usual way to avoid the effects of the parasitic MOS transistor is to connect together the polysilicon layer with the diffused emitter region. Since the emitter is normally biased in magnitude at the highest potential, the gate of the p-channel or N-channel MOS transistor will be at the same potential so that the transistor will always be off.

The effect of the bipolar parasitic transistor is to generate a leakage to the substrate which reduces the efficiency of the bipolar lateral transistor as well as being a potential problem for other circuits resident on the same substrate.

Accordingly, it is the principal object to provide an improved bipolar transistor in an MOS or CMOS process. It is a further object to provide a bipolar transistor in a MOS or CMOS process having a minimal emitter to substrate leakage.

SUMMARY OF THE INVENTION

According to the invention there is a method of forming a lateral bipolar transistor in a semiconductor substrate of a second conductivity type by a MOS or CMOS process which includes growing a thin insulating layer over the substrate and diffusing a tank region of a first type of conductivity into the semiconductor substrate of a polarity opposite to that of the second conductivity type. A strip of polysilicon is deposited around a region between the emitter area and collector area on a face of the substrate over said oxide. Next an emitter region of the first conductivity type located within the polysilicon strip and a collector region located outside of the strip are diffused into the tank. The polysilicon prevents diffusion of implanted impurity into the tank region over which is superimposed the polysilicon. An electrically conducting layer is formed over the emitter and a portion of the polysilicon.

By using a strip of polysilicon to limit the diffusion of the emitter and collector regions and by forming the emitter contact over both the emitter and polysilicon it is possible to achieve a smaller emitter geometry than is otherwise possible. For a given emitter perimeter, reductions in the planar area of the emitter achieve a signficantly reduced leakage current due to the vertical parasitic bipolar transistor. The effect of the lateral MOS transistor is substantially avoided by electrically interconnecting the polysilicon and the diffused emitter region.

BRIEF DESCRIPTION OF THE DRAWINGS

The novel features believed characteristic of the invention are set forth in the appended claims. The invention itself, however, as well as other features and advantages thereof, will be best understood by reference to the detailed description which follows, read in conjunction with the accompanying drawings, wherein:

DETAILED DESCRIPTION WITH REFERENCE TO THE DRAWINGS

Figure 1:
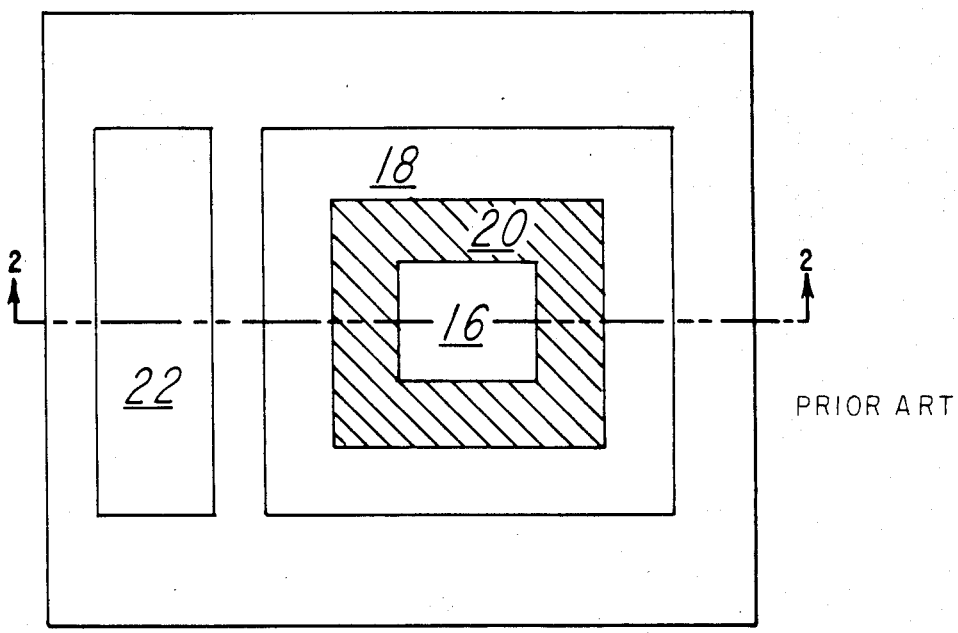
FIG. 1 is a greatly enlarged plan view of a small portion of a semiconductor chip showing a lateral bipolar transistor according to the prior art.
Figure 2:
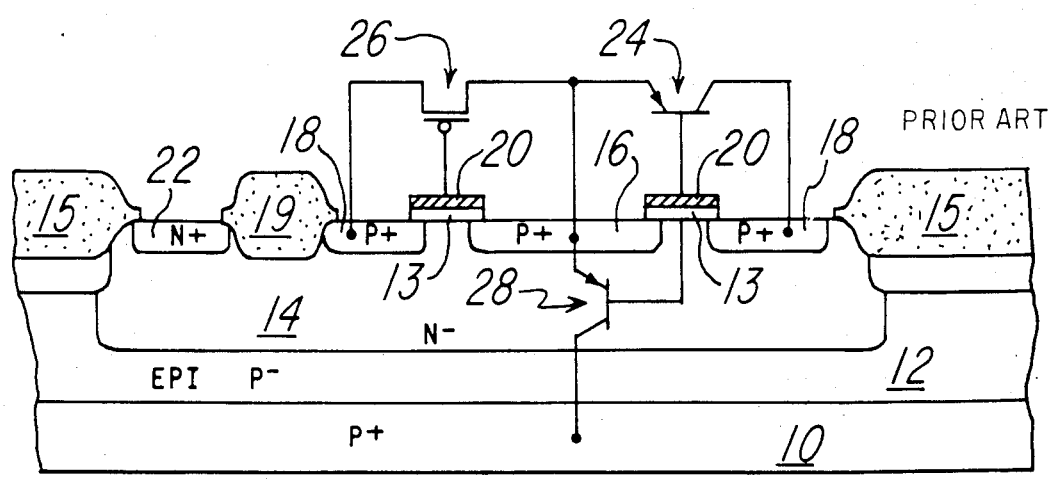
FIG. 2 is an elevation view in section of the transistor of FIG. 1 taken along the line 2—2.

Referring to FIGS. 1 and 2, there is shown a conventional type of lateral bipolar transistor 24 formed on a portion of a semiconductor chip. The transistor 24 is formed in a diffused N-tank region 14. Tank 14 itself is formed by diffusion through a P epitaxial region 12 in a P+ substrate 10. Along the face of N-tank region 14 are three shallow diffused P+ type conductivity regions including a square central emitter region 16 and a spaced apart rectangular strip collector region 18 which surrounds the emitter 16. A shallow N+ type conductivity region formed along one side of the tank 14 separated from the P+ regions by a field oxide region 19 functions as a base contact region 22. A rectangular layer of polysilicon 20 overlies the region between emitter 16 and collector 18 and rests on a thin layer of silicon oxide 13 approximately 350 Angstroms thick. Field oxide regions 15 isolate the lateral transistor from other circuit regions on the same substrate.

The lateral transistor 24 is formed by diffused emitter 16, diffused collector 18 and the tank base region 14. As shown schematically in FIG. 2 incidental to the lateral bipolar transistor 24 there is a parasitic MOS transistor 26 formed by the polysilicon layer 20 in combination with the emitter 16 and collector 18 regions. There is also a parasitic vertical bipolar transistor 28 formed by the emitter 16, the tank 14 as base and the P+ substrate 10 as collector.

The effect of the parasitic MOS transistor 26 is to cause a current leakage from emitter 16 to collector 18 and for the parasitic vertical transistor 28 to cause a current leakage to substrate 10. Since normally the emitter 16 is biased to a higher voltage than either the base 14 or collector 18 the effect of the MOS transistor 26 can be compensated for by connecting the polysilicon layer 20 to the emitter 16 so as to bias the MOS transistor off.

The effect of the parasitic vertical transistor 28 depends on the penetration depth of the tank 14 being the base length of transistor 28, the tank doping level in the vertical direction of the tank 14 and the planar area of the emitter diffusion 16. The lower the base length and tank doping level and the higher the planar area of the emitter 16, the higher will be the vertical efficiency of the vertical transistor 28. The efficiency of the lateral transistor 24 depends, however, on the base length between the emitter 16 and collector 18, on the tank doping level at the surface and the area of the rounded portion of the emitter 16 facing the collector 18. The lower the base length and surface doping level of the tank and the higher the latter area, the higher will be the efficiency of the lateral transistor. Since the lateral transistor base length and tank surface doping level and the vertical transistor base length and vertical doping level of the tank are dictated by the process and mask making constraints only the planar area and the perimeter of the emitter diffusion are available for optimization of the lateral transistor efficiency versus the vertical transistor efficiency.

Since the area of the rounded portion of the emitter 16 depends on the perimeter of this portion by maximizing the ratio of this perimeter to the planar area of the emitter 16 one minimizes the ratio of the efficiency of the vertical transistor 28 to that of the lateral bipolar transistor 24.

Figure 3:
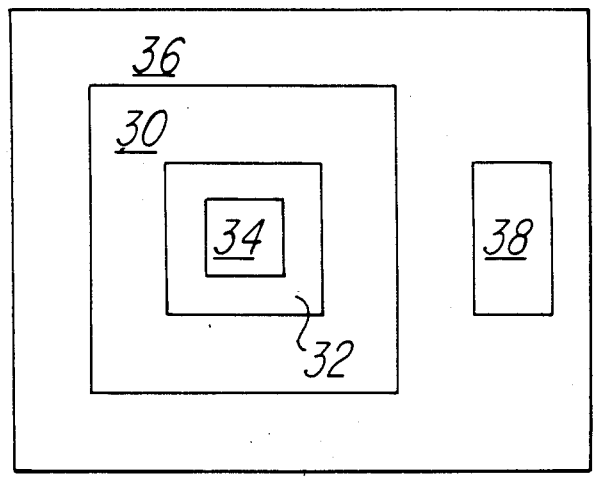
FIG. 3 is a greatly enlarged plan view of a small portion of a semiconductor chip showing a lateral bipolar transistor according to the prior art.

By way of numerical examples if one takes as a figure of merit the relative efficiencies of lateral to vertical bipolar transistor efficiencies as P/A where P is the perimeter of the rounded portion of the emitter and A is the planar area of the emitter 16 then for a conventional 2 micron layout rule for CMOS processes one would obtain the structure shown in plan in FIG. 3. In this case the emitter 32 must be 4 microns along each side in order for there to be an emitter contact 34 which is 2 microns square. The collector 36 must also be separated from the emitter 32 by a 2 micron base length of base region 30. A collector contact region 38 is shown formed along one side of the collector region 36. In this case the ratio P/A is 16 microns/16 microns$^2$ or 1 units of 1/micron.

Figure 4:
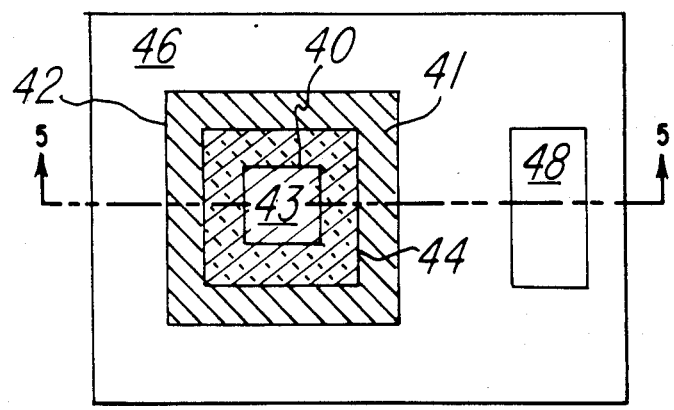
FIG. 4 is a greatly enlarged plan view of a small portion of a semiconductor chip showing a lateral bipolar transistor according to a preferred embodiment of the invention.

According to the invention, one can fabricate the basic structure of the lateral bipolar transistor shown in FIG. 3 by utilizing polysilicon to define the emitter diffusion as shown in FIG. 4. In this case the emitter 40 is 2 microns along each edge and the collector 46 is spaced 2 microns away from the emitter 40 surrounding the latter. A rectangular strip of polysilicon 42 overlies the region between the emitter 40 and collector 46. A field oxide 51 (as seen in FIG. 5i) isolates one lateral bipolar transistor from another. A field oxide region 39 isolates a diffused base 45 from the diffused emitter 40 and collector 46. An aluminum contact 47 contacts base 45. A layer of PSG, etched and reflowed is used to define the contact regions while an aluminum contact 43 overlies the emitter 40 and extends halfway over the polysilicon layer 42. In this case P/A is 2 in units of 1/micron which means that the substrate leakage of the lateral bipolar transistor of FIG. 4 is expected to be ½ that of FIG. 3.

Figure 6:
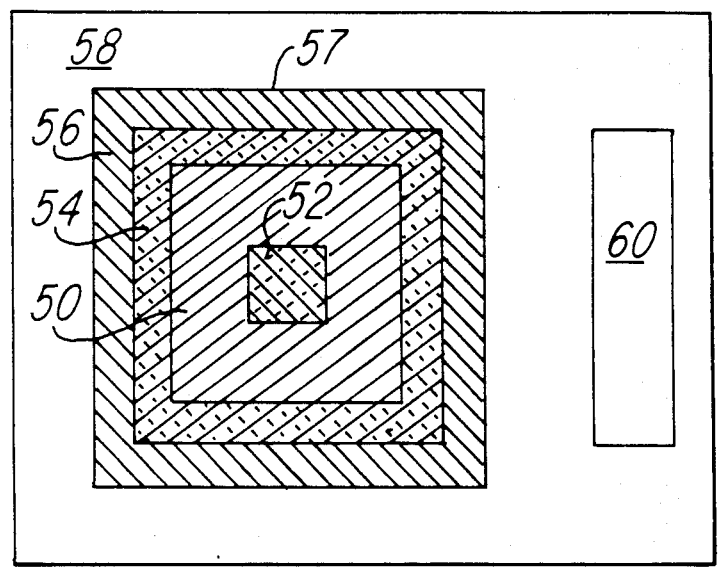
FIG. 6 is a greatly enlarged plan view of a small portion of a semiductor chip showing a variant of the structure of FIG. 4 having a nondiffused portion in the center of the emitter.

In analog circuitry, in addition to having a high P/A ratio, it is important to have a minimum variation in performance from one device to another since performance depends in large part on matching. It is normal to use emitter geometries with at least a 6 micron length along each side. If constructed similar to the transistor of FIG. 3a transistor with a 6 micron length along each emitter edge would have a ratio of P/A equal to 24/36 or 2/3 in units of 1/micron. If one uses polysilicon to define the emitter region as shown in FIG. 6 it is possible to leave a 2 micron×2 micron square of undiffused region 52 in the center of the emitter 50. The remaining structure is similar to that of FIG. 4 in that the base 56 is covered with a 2 micron wide strip of polysilicon 57. A metal contact 54 extends over emitter 50 and halfway over the polysilicon layer 57. A collector contact region 60 is provided along one side of the collector 58. In this case the P/A ratio is 24/32 or ¾. This means that a 12% reduction in leakage current to the substrate is achieved by the foregoing modification in emitter geometry.

Figure 7:
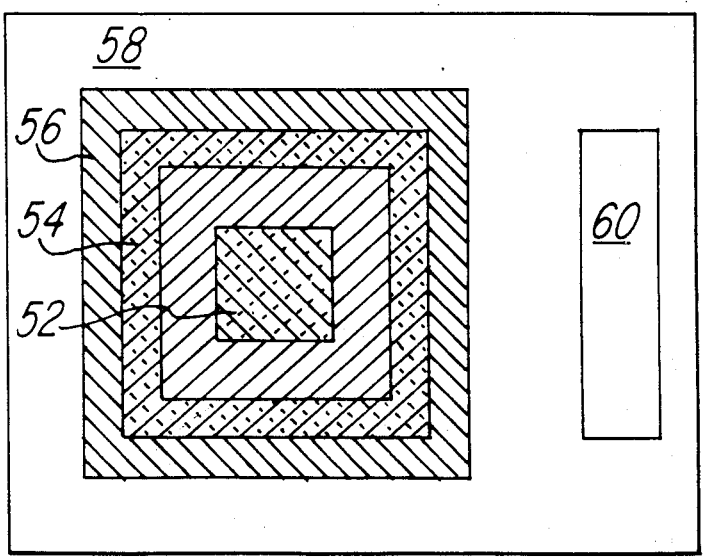
FIG. 7 is a variant of the transistor of FIG. 6.
Figure 8:
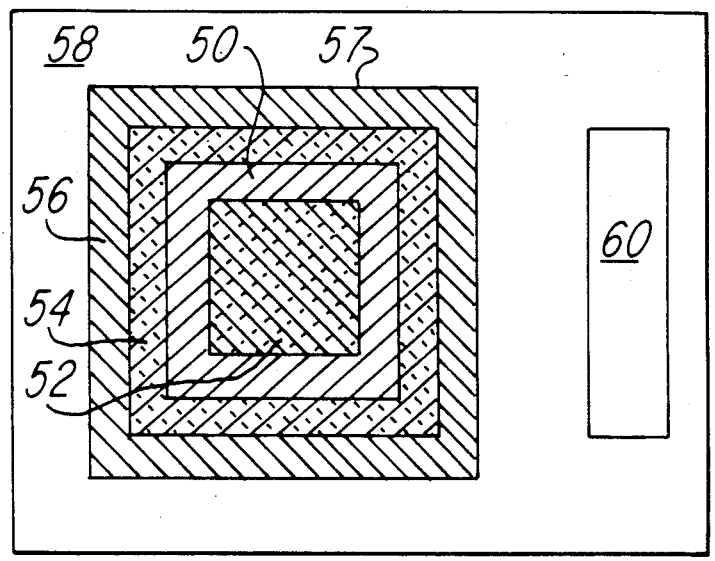
FIG. 8 is yet another variant of the transistor of FIG. 6.

By shrinking the layout rule to 1.5 and 1.0 microns one obtains the structures shown in FIGS. 7 and 8, respectively, which have ratios of P/A equal to 0.888 and 1.2, respectively.

Figure 9:
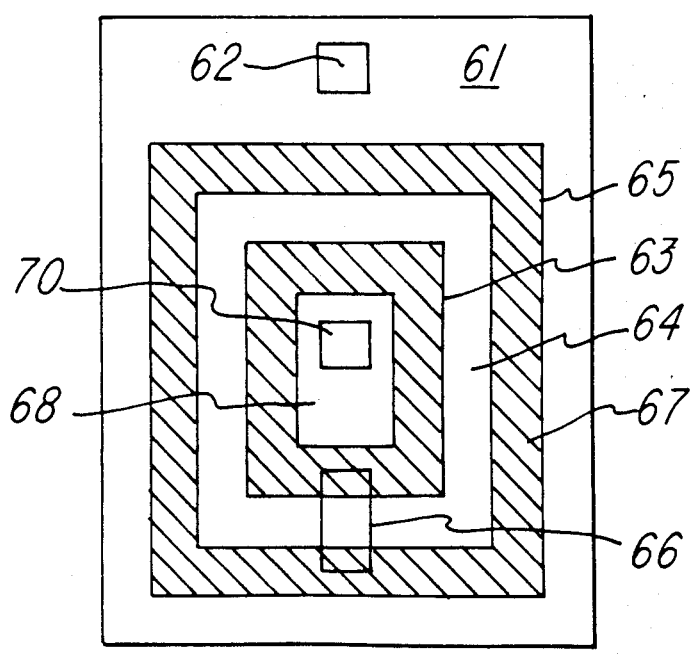
FIG. 9 is a greatly enlarged plan of a small portion of a semiconductor chip showing a lateral bipolar transistor having an inner and outer collector.

Another variant of the invention is shown in FIG. 9 which incorporates an additional inner collector 68 with a collector contact region 70 spaced from a rectangular emitter band by a rectangular strip of polysilicon 63. A second rectangular strip of polysilicon 65 surrounds the emitter 64 and overlies an outer base region 67 separating emitter 64 from outer collector 61. A collector contact region 62 is formed in the outer collector 61. A metal strip 66 overlies the emitter 64 and extends halfway over each of the inner 63 and outer 65 polysilicon strips so as to bias the gates of the parasitic MOS transistors at emitter potential. For this structure the value of P/A using the 2 micron layout rule is 1 in units of 1/micron.

Figure 5A:
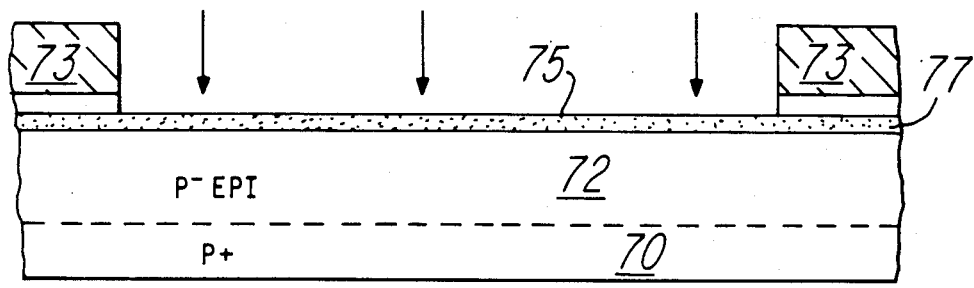
FIGS. 5a to 5j are successive fabrication steps showing in elevation the process leading to the structure shown in FIG. 5i which corresponds to that shown in FIG. 4 taken along line 5—5.

The structure of FIG. 4 can be fabricated in accordance with the steps set forth in FIGS. 5a to 5e. First a slice of P-monocrystalline silicon typically 4 inches in diameter, cut on the [100] plane of a resistivity of about 25 ohm-cm, or, alternately, p- epi on a P+ substrate is selected. The transistor shown in FIG. 4 is only a very small part of one bar or chip, which, in turn, is only one small part of the slice. One slice contains severall hundred bars. After cleaning, the slice is oxidized by exposing it to pyrogenic steam in a furnace at an elevated temperature of 900° C. to produce an oxide layer 75 of a thickness of about 350 Angstroms over the whole slice. Next a layer of silicon nitride 77 of about 1300 Angstroms thickness is formed over the entire slice by exposing it to an atmosphere of dichlorosilane and ammonia in a reactor. A coating of photoresist 73 is applied to the entire top surface of the slice and then exposed to ultra violet light through a mask which defines the pattern of a thick field oxide region 78 (see FIG. 5b) and N- tank region 81. The resist is developed leaving areas where nitride is then removed by etching the exposed part of the nitride layer 77 but leaving in place the oxide layer 75 as seen in FIG. 5a.

Figure 5B:
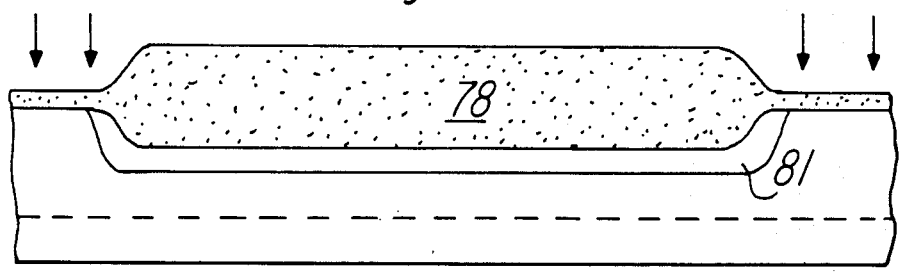
Figure 5C:
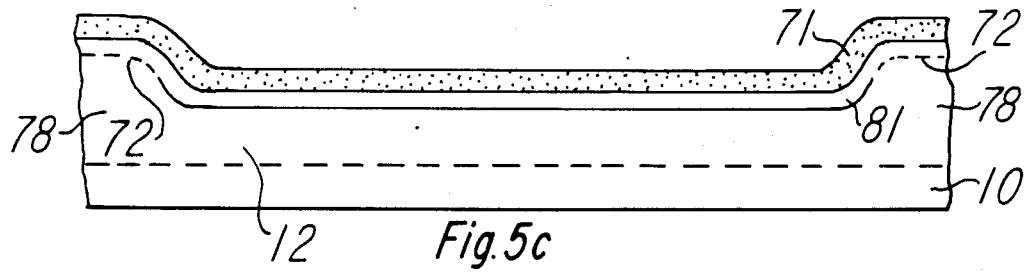
Figure 5D:
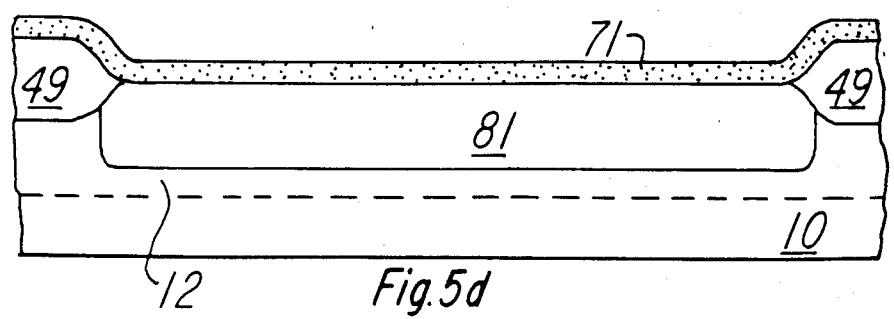

Using photoresist 73 and nitride 77 as a mask, the slice is subjected to a phosphorous implant in the region to correspond with the N tank region 81 as seen in FIG. 5b. The photoresist 73 is removed and the slice is heated to a temperature of about 1000° C. to cause the growth of a thick N-tank oxide 78 of about 5500 Angstroms thick which consumes some of the silicon below. Phosphorous diffuses ahead of the thick tank oxide 78. The silicon nitride 77 is then stripped and boron is implanted in what are to become thick field oxide regions at either end of the tank oxide 78. The tank oxide is then stripped and a moat oxide 71 is grown to a thickness of about 400 Angstroms at 1000° C. in an atmosphere of oxygen and hydrogen chloride. The phosphorous and boron are then diffused by heating the slice in a nitrogen atmosphere to about 1100° C. for about 25 hours to form N tank 81 and p regions 49 as shown in FIG. 5d.

Figure 5E:
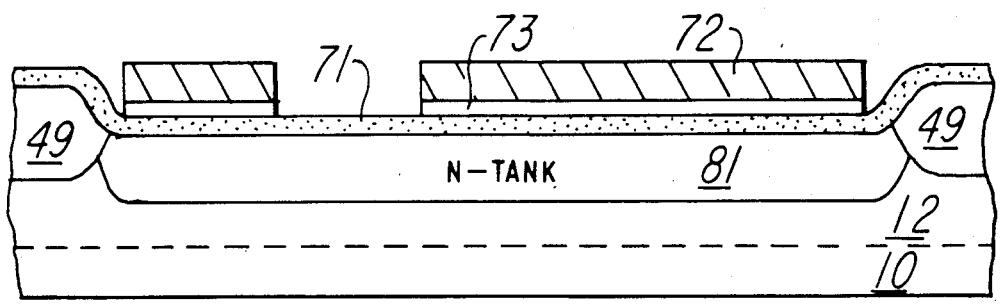
Figure 5F:
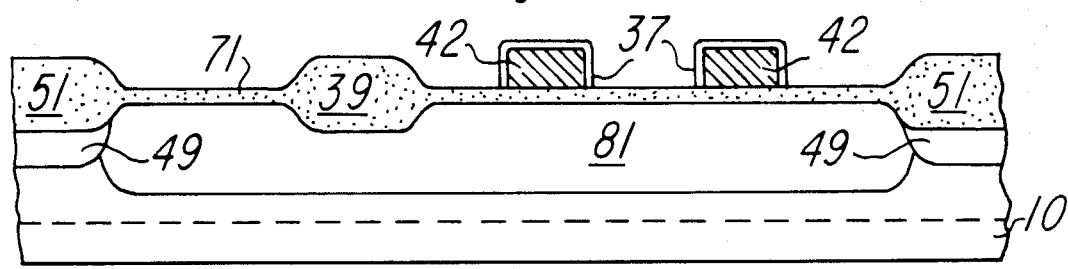
Figure 5G:
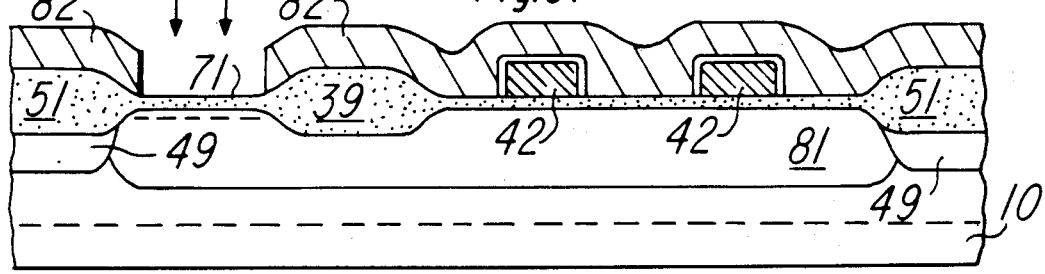
Figure 5H:
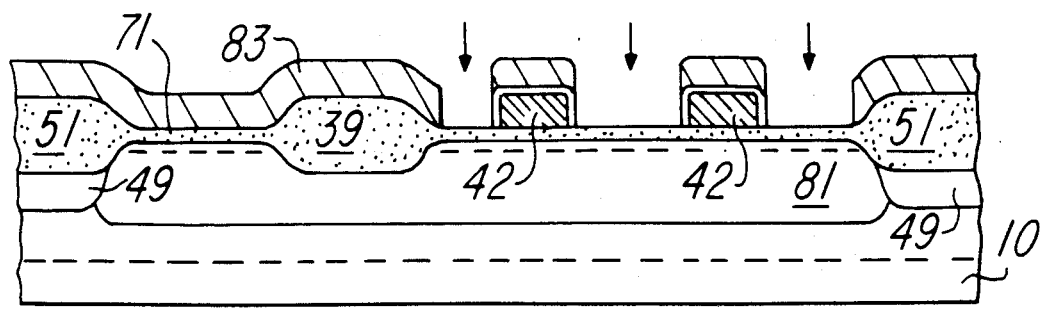
Figure 5I:
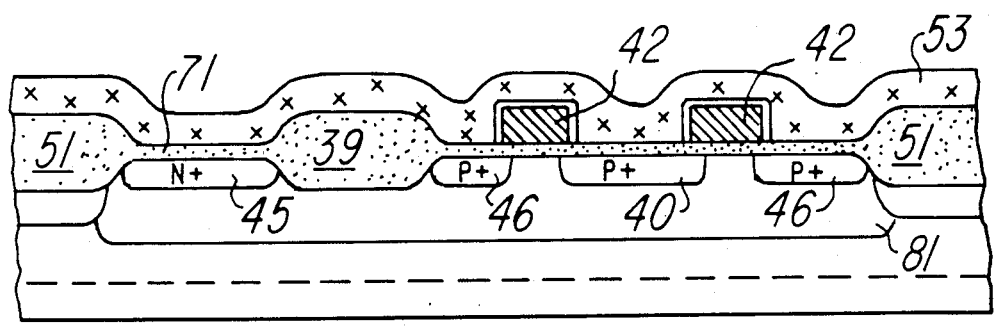
Figure 5J:
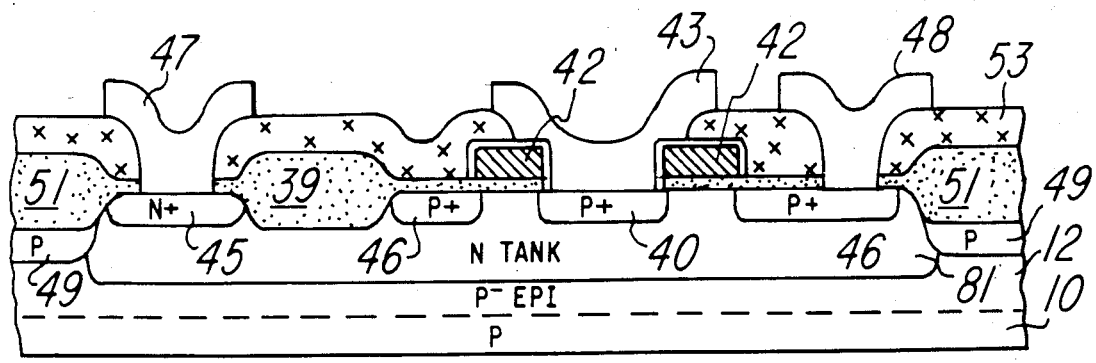

Referring to FIG. 5e, a layer of silicon nitride 73 and then photoresist 72 are deposited, patterned and then plasma etched to open regions in which field oxide is to be grown. The photoresist 72 is stripped and field oxide regions 39 and 51 are grown at a temperature of 900° C. to a thickness of about 8000 Angstroms as seen in FIG. 5f. A layer of polysilicon 42 is deposited, patterned and etched to form a rectangular strip as viewed in plan and as seen in elevation in FIG. 5f and then a thin oxide is grown over the polysilicon strip. Photoresist 82 is once again deposited, patterned and developed to open a base region. A phosphorous implant is then made. The photoresist 82 is stripped then a new layer of photoresist 83 is deposited, patterned and developed to open regions around the polysilicon 42 to receive a boron implant. Following the boron implant the photoresist 83 is removed and the slice heated to diffuse the boron and phosphorous as shown in FIG. 5i. A layer of PSG 51 is deposited, patterned and etched to open contact areas to the base 47, the emitter 40 and to the collector 46. The layer of PSG 51 acts as a passivation layer. Aluminum is then sputtered over the surface, patterned and etched to form contacts to the emitter 40, base 47 and collector 46 as seen in FIG. 5j.

The concept of the invention is also applicable to a P− tank and N+ diffused emitter and collector regions with an N− EPI region and an N+ substrate.

While this invention has been described with reference to an illustrative embodiment, this description is not intended to be construed in a limiting sense. Various modifications of the illustrative embodiment, as well as other embodiments of the invention, will be apparent to persons skilled in the art upon reference to this description. It is, therefore, contemplated that the appended claims will cover any such modifications or embodiments as fall within the true scope of the invention.

What is claimed:

1. A method of making a lateral bipolar transistor in a MOS or CMOS process in a semiconductor substrate, comprising:

depositing a thin layer of insulator over the substrate;

diffusing a tank region of a first type of conductivity into the substrate, said substrate is of a second type of conductivity opposite in polarity to the first type of conductivity;

depositing a layer of polysilicon onto the insulator;

patterning the layer of polysilicon so that it overlies a base area between an emitter and a collector forming region; and diffusing shallow emitter and collector regions of the second type of conductivity into said tank region;

wherein the layer of polysilicon closes on itself, said emitter and collector diffusions are self-aligned to said polysilicon layer and said diffused emitter region is in the form of a band enclosing an undiffused central region when viewed in plan.

2. A method according to claim 1, wherein said collector encloses said polysilicon layer and said emitter.

3. A method according to claim 2, including patterning the polysilicon so that it overlies a base area between the emitter and inner collector forming region located within the emitter forming region, diffusing a shallow collector region of the second type of conductivity into said inner collector forming region and depositing an electrically conducting layer over said emitter and over portions of both of said polysilicon layers.

4. A method according to claim 2, wherein said first type of conductivity region is an N type region and said second type of conductivity region is a P type region.

5. A method according to claim 4, wherein said emitter and collector are P+ type conductivity regions and said tank is an N-type conductivity region.

6. A method according to claim 2, wherein said first type of conductivity region is a P type region and said second type of conductivity region is an N type region.

7. A method according to claim 6, wherein said emitter and collector are N- type conductivity regions and said tank is a P+ type conductivity region.

8. A method according to claim 2, wherein the emitter, polysilicon and inner edge of the collector are square.

9. A method according to claim 8, wherein the area of the emitter is 4 square microns and its perimeter is approximately 8 microns.

10. A method according to claim 1, including depositing an electrically conductive layer over at least a portion of said emitter and extending over and making contact with said polysilicon layer.

11. A method according to claim 1, wherein said insulator is oxide.

* * * * *